(12) United States Patent
Aknin et al.

(10) Patent No.: US 9,064,065 B2
(45) Date of Patent: Jun. 23, 2015

(54) COUPLING ARCHITECTURAL AND IMPLEMENTATION/BEHAVIORAL MODELS OF A COMPUTER-BASED SYSTEM

(71) Applicant: International Business Machines Corporation, Armonk, NY (US)

(72) Inventors: Aharon L. Aknin, Kiryat Ono (IL); Shay Atzitz, Rishon Le-Zion (IL); Irena Kostan, Hehaluz (IL); Shy Matza, Nes-Ziona (IL); Ran Rinat, Tel Aviv (IL); Omer Shadmi, Rehovot (IL); Raz M. Yerushalmi, Kfar Warburg (IL)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 13/838,383

(22) Filed: Mar. 15, 2013

(65) Prior Publication Data
US 2013/0211810 A1    Aug. 15, 2013

Related U.S. Application Data

(63) Continuation of application No. 12/884,709, filed on Sep. 17, 2010.

(51) Int. Cl.
  *G06G 7/48* (2006.01)
  *G06F 9/44* (2006.01)
  *G06F 17/50* (2006.01)

(52) U.S. Cl.
  CPC .............. *G06F 17/5009* (2013.01); *G06F 8/10* (2013.01); *G06F 17/5095* (2013.01); *G06F 8/30* (2013.01); *Y02T 10/82* (2013.01)

(58) Field of Classification Search
  CPC .......................... G06F 17/5095; G06F 17/5009
  USPC ............................................................ 703/8
  See application file for complete search history.

(56) References Cited

U.S. PATENT DOCUMENTS 7,219,328 B2    5/2007  Schloegel et al.
7,730,410 B2 *  6/2010  Goering ........................ 715/741
(Continued)

OTHER PUBLICATIONS

"AUTOSAR Standard" detailing the methodology (Published Jun. 28, 2006, http://www.autosar.org/index.php?p=3&up=6&uup=3&uuup=0; AUTOSARv1.0.1 hereafter). pp. 1-31.*
(Continued)

*Primary Examiner* — Akash Saxena
(74) *Attorney, Agent, or Firm* — Janaki K. Davda; Konrad, Raynes, Davda & Victor LLP

(57) ABSTRACT

Coupling architectural and implementation/behavioral models of a computer-based system by creating a bridge element, defining a port of the bridge element, associating the port of the bridge element with a port of an implementable element of an architectural model of a computer-based system and a port of an implementation element of an implementation/behavioral model of the computer-based system, mapping an interface member of the implementation element port to an interface member of the implementable element port, generating, from a template, skeleton source code applicable for the mapped interface member, generating a usage description element for the architectural model corresponding to the mapped interface member, generating an architectural description document from the architectural model, generating implementation code from the implementation/behavioral model and the generated skeleton source code, and generating a declaration file for an operating system service for use by the implementation code.

13 Claims, 5 Drawing Sheets

(56) References Cited

U.S. PATENT DOCUMENTS

| | | | |
|---|---|---|---|
| 7,809,534 B2* | 10/2010 | Sturrock et al. | 703/2 |
| 7,853,941 B1* | 12/2010 | Niggemann et al. | 717/169 |
| 8,296,723 B2* | 10/2012 | Hanner et al. | 717/104 |
| 8,359,183 B1* | 1/2013 | Aldrich | 703/2 |
| 8,433,550 B2* | 4/2013 | Rheaume | 703/8 |
| 8,448,130 B1* | 5/2013 | Pillarisetti et al. | 717/104 |
| 8,458,655 B1* | 6/2013 | Linebarger et al. | 717/113 |
| 8,484,009 B2* | 7/2013 | Mohalik et al. | 703/19 |
| 8,577,651 B2* | 11/2013 | Moore | 703/6 |
| 8,577,654 B2* | 11/2013 | Moore | 703/6 |
| 8,583,707 B2* | 11/2013 | Matsumura et al. | 707/809 |
| 8,594,984 B2 | 11/2013 | Moore | |
| 2007/0180424 A1 | 8/2007 | Kazakov et al. | |
| 2007/0277151 A1* | 11/2007 | Brunel et al. | 717/113 |
| 2007/0288885 A1 | 12/2007 | Brunel et al. | |
| 2008/0263506 A1 | 10/2008 | Broadfoot et al. | |
| 2008/0313600 A1* | 12/2008 | Moore | 717/104 |
| 2009/0007084 A1 | 1/2009 | Conallen et al. | |
| 2009/0132993 A1* | 5/2009 | Mani et al. | 717/105 |
| 2009/0150854 A1 | 6/2009 | Elaasar et al. | |
| 2010/0058276 A1* | 3/2010 | Felder et al. | 716/17 |
| 2010/0292867 A1* | 11/2010 | Bohm et al. | 701/1 |
| 2010/0312364 A1* | 12/2010 | Eryilmaz et al. | 700/30 |
| 2011/0072410 A1* | 3/2011 | Lee et al. | 717/104 |
| 2011/0231178 A1* | 9/2011 | Gery et al. | 703/22 |
| 2011/0252406 A1* | 10/2011 | Gowri et al. | 717/126 |
| 2011/0282640 A1* | 11/2011 | Mohalik et al. | 703/17 |
| 2012/0011097 A1* | 1/2012 | Matsumura et al. | 707/606 |
| 2012/0016654 A1* | 1/2012 | Moore | 703/22 |
| 2012/0072198 A1 | 3/2012 | Aknin et al. | |
| 2012/0084070 A1* | 4/2012 | Moore | 703/22 |
| 2012/0254827 A1* | 10/2012 | Conrad et al. | 717/104 |
| 2013/0042257 A1* | 2/2013 | Mani et al. | 719/318 |
| 2013/0073063 A1* | 3/2013 | Kiffmeier et al. | 700/86 |
| 2013/0103379 A1* | 4/2013 | Nam et al. | 703/22 |
| 2013/0198713 A1* | 8/2013 | Zhang et al. | 717/106 |

OTHER PUBLICATIONS

Boldt, R. and P. Schedl, "Creating AUTOSAR Systems Models Using the Combined Power of UML and SysML", Automotive Industries AI, vol. 187, No. 11, Nov. 2007, Total 24 pp.

Brorkens, M. and M. Koster, "Improving the Interoperability of Automotive Tools by Raising the Abstraction from Legacy XML Formats to Standardized Metamodels", D.H. Akehurst, R. Vogel, and R.F. Paige (Eds.): ECMDA-FA 2007, LNCS 4530, © Springer-Verlag Berlin Heidelberg, 2007, Total 9 pp. (Also, Model Driven Architecture—Foundations and Applications, Proceedings Third European Conference, ECMDA-FA 2007, pp. 59-67.).

Paul, M. and S. Rooks, "AUTOSAR System Modeling in IBM Rational Systems Developer", © IBM Corporation 1994, 2007, Total 15 pp.

Pagel, M. and M. Brorkens, "Definition and Generation of Data Exchange Formats in AUTOSAR", © Springer-Verlag, 2006, Total 14 pp. (Also, Model Driven Architecture-Foundations and Applications. Second European Conference, ECMDA-FA 2006, Proceedings (Lecture Notes in Computer Science vol. 4066), pp. 52-65.)).

Son, J., I. Wilson, W. Lee, and S. Lee, "Software Architecture for Model Based Automotive System Development and its Application", The 13th International Pacific Conference on Automotive Engineering, Aug. 2005, Total 5 pp.

dSPACE GmbH, "AUTOSAR Architecture—and Behavior Modeling—The Interaction of SystemDesk and TargetLink" [online], © 2010 dSPACE GmbH, [Retrieved on Sep. 8, 2010]. Retrieved from the Internet at <URL: http://www.dspace.com/en/inc/home/support/kb/supapnot/targetlink/ds_tl_app_autosar_architect.cfm>, Total 1 p.

AUTOSAR, "AUTOSAR", [online], [Retrieved on Sep. 30, 2010]. Retrieved from the Internet at <URL: http://www.autosar.org/>, © 2003 AUTOSAR, Total 2 pp.

Preliminary Amendment, Mar. 15, 2013, for U.S. Appl. No. 12/884,709, filed Sep. 17, 2010 by A.L. Aknin et al., Total 7 pp. [57.228 (PrelimAmend)].

Final Office Action, Apr. 4, 2014, for U.S. Appl. No. 12/884,709, filed Sep. 17, 2010 by A.L. Aknin et al., Total 18 pp. [57.228 (FOA1)].

Hause, M. and F. Thom, "Building Bridges Between Systems and Software with SysML and UML", Apr. 8, 2008, Total 15 pp.

IBM, "AUTOSAR: from Concept to Code", White Paper, Dec. 2009, Total 12 pp.

Notice of Allowance 1, Aug. 29, 2014, for U.S. Appl. No. 12/884,709, filed Sep. 17, 2010 by A.L. Aknin et al., Total 17 pp. [57.228 (NOA1)].

Office Action 1, Dec. 16, 2013, for U.S. Appl. No. 12/884,709, filed Sep. 17, 2010 by A.L. Aknin et al., Total 23 pp. [57.228 (OA1)].

Response to Final Office Action 1, Jul. 4, 2014, for U.S. Appl. No. 12/884,709, filed Sep. 17, 2010 by A.L. Aknin et al., Total 13 pp. [57.228 (RFOA1)].

Response to Office Action 1, Mar. 17, 2014, for U.S. Appl. No. 12/884,709, filed Sep. 17, 2010 by A.L. Aknin et al., Total 14 pp. [57.228 (ROA1)].

Notice of Allowance 2, Dec. 12, 2014, for U.S. Appl. No. 12/884,709, filed Sep. 17, 2010, A.L. Aknin et al., Total 14 pp. [57.228 (NOA2)].

\* cited by examiner

COUPLING ARCHITECTURAL AND IMPLEMENTATION/BEHAVIORAL MODELS OF A COMPUTER-BASED SYSTEM

CROSS-REFERENCE TO RELATED APPLICATION

This patent application is a continuation of U.S. patent application Ser. No. 12/884,709, filed Sep. 17, 2010, which patent application is incorporated herein by reference in its entirety.

BACKGROUND

1. Field

Embodiments of the invention relate to computer system modeling in general, and more particularly to coupling architectural and implementation/behavioral models of a computer-based system.

2. Description of the Related Art

Computer-based systems may be modeled using various modeling methodologies. One type of modeling methodology may be used to produce an architectural model of a system that is not specific to any specific operating environment, where the implementation/behavioral details of the various model components are not modeled, but where adapting the system for a specific operating environment requires manual coding. Another type of modeling methodology may be used to produce a model that is more geared to modeling the implementation/behavioral details of the various model components for a specific operating environment, where source code or other artifacts may, as a result, be generated for the specific operating environment, but where adapting the system for other operating environments requires revising the model for each specific operating environment.

BRIEF SUMMARY

In one aspect of the invention, a method is provided for coupling architectural and implementation/behavioral models of a computer-based system, the method including creating a bridge element, defining a port of the bridge element, associating the port of the bridge element with a port of an implementable element of an architectural model of a computer-based system and a port of an implementation element of an implementation/behavioral model of the computer-based system, mapping an interface member of the implementation element port to an interface member of the implementable element port, generating, from a template, skeleton source code applicable for the mapped interface member, generating a usage description element for the architectural model corresponding to the mapped interface member, generating an architectural description document from the architectural model, generating implementation code from the implementation/behavioral model and the generated skeleton source code, and generating a declaration file for an operating system service for use by the implementation code.

In another aspect of the invention, a system is provided for coupling architectural and implementation/behavioral models of a computer-based system, the system including an architectural model builder configured to build an architectural model of a computer-based system, an implementation/behavioral model builder configured to build an implementation/behavioral model of the computer-based system, a bridge model builder configured to create a bridge element, define a port of the bridge element, associate the port of the bridge element with a port of an implementable element of the architectural model and a port of an implementation element of the implementation/behavioral model, map an interface member of the implementation element port to an interface member of the implementable element port, generate, from a template, skeleton source code applicable for the mapped interface member, and generate a usage description element for the architectural model corresponding to the mapped interface member, and a work product generator configured to generate an architectural description document from the architectural model, generate implementation code from the implementation/behavioral model and the generated skeleton source code, and generate a declaration file for an operating system service for use by the implementation code.

A computer program product implementing the invention is also provided.

BRIEF DESCRIPTION OF THE SEVERAL VIEWS OF THE DRAWINGS

Embodiments will be understood and appreciated more fully from the following detailed description taken in conjunction with the appended drawings in which.

DETAILED DESCRIPTION

Figure 1:
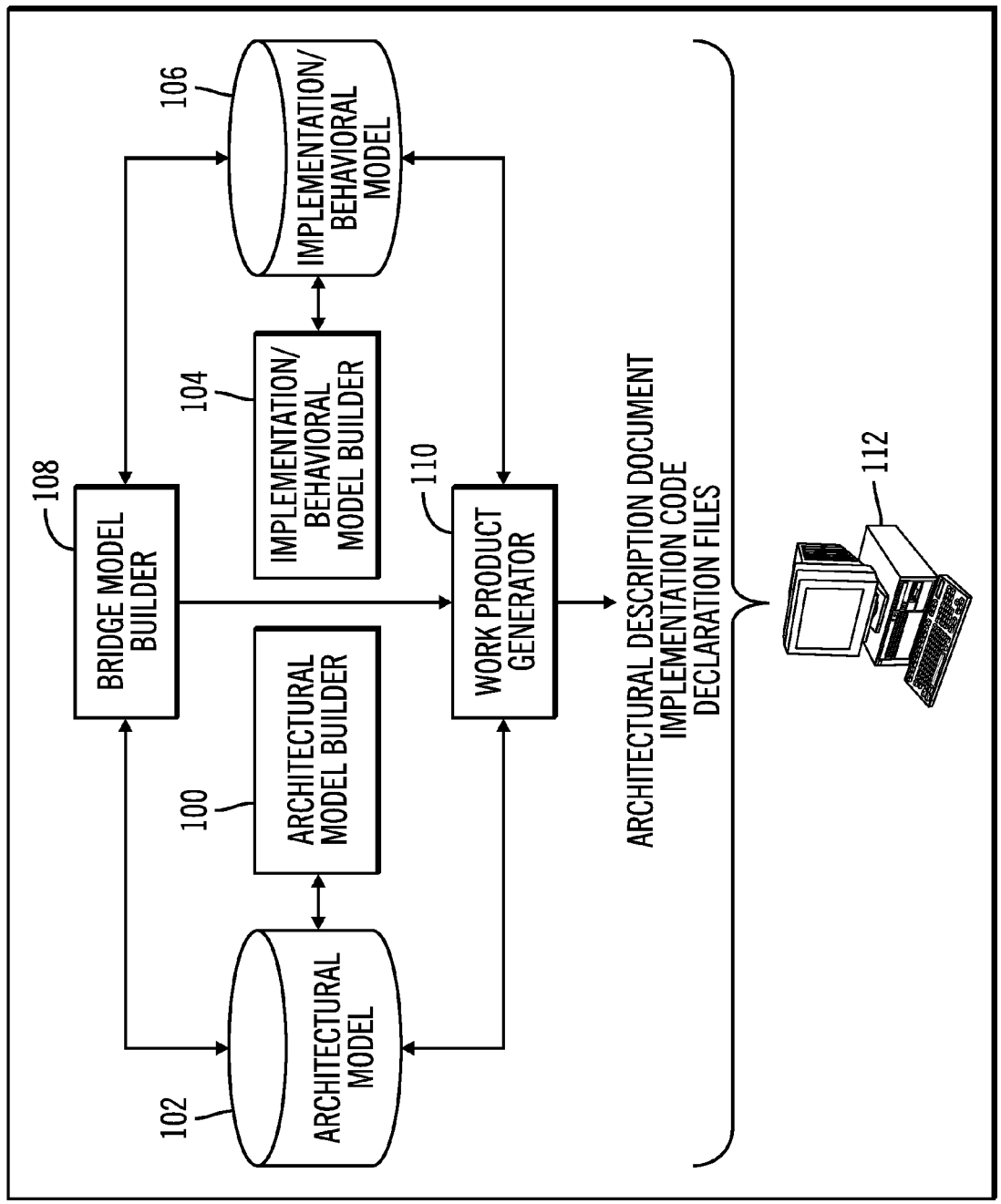
FIG. 1 is a simplified conceptual illustration of a system for coupling architectural and implementation/behavioral models of a computer-based system, constructed and operative in accordance with embodiments of the invention.

In the following description, reference is made to the accompanying drawings which form a part hereof and which illustrate several embodiments of the invention. It is understood that other embodiments may be utilized and structural and operational changes may be made without departing from the scope of the invention.

The embodiments of the invention are now described within the context of one or more embodiments, although the description is intended to be illustrative of the invention as a whole, and is not to be construed as limiting the invention to the embodiments shown. It is appreciated that various modifications may occur to those skilled in the art that, while not specifically shown herein, are nevertheless within the true spirit and scope of the invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical data storage device, a magnetic data storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The code implementing the described operations may further be implemented in hardware logic or circuitry (e.g., an integrated circuit chip, Programmable Gate Array (PGA), Application Specific Integrated Circuit (ASIC), etc.

Reference is now made to FIG. 1, which is a simplified conceptual illustration of a system for coupling architectural and implementation/behavioral models of a computer-based system, constructed and operative in accordance with embodiments of the invention. In the system of FIG. 1, an architectural model builder 100 is configured to be used by a system architect to build an architectural model 102 of a computer-based system, such as in accordance with a modeling methodology that supports the Automotive Open System Architecture (AUTOSAR). An implementation/behavioral model builder 104 is configured to be used by the system architect to build an implementation/behavioral model 106 of the computer-based system, such as in accordance with the Uniform Modeling Language (UML)/Systems Modeling Language (SysML) modeling methodology.

A bridge model builder 108 is configured to be used by the system architect to create one or more bridge elements which may be introduced into either of architectural model 102 or the implementation/behavioral model 106 or may exist independently of models 102 and 106. Bridge model builder 108 is configured to be used to define one or more ports of a bridge element, and associate each port of the bridge element with a port of an implementable element of architectural model 102, such as of an Atomic Software Component of an AUTOSAR architectural model, and a port of an implementation element of implementation/behavioral model 106, such as of a class of a UML/SysML model. Bridge model builder 108 is configured to be used, for each such bridge association, to map the members of the interface of the associated implementation element port to the members of the interface of the associated implementable element port. This mapping may be performed automatically using any known automatic mapping technique, such as where the member names and types of one interface match those of the other interface, or may be performed manually. Bridge model builder 108 is configured to be used to define one or more behaviors for one or more of the mapped interface members. Bridge model builder 108 is configured to be used, for each mapped interface member, to generate skeleton source code for implementation/behavioral model 102 from templates, where the source code represents one or more actions that are applicable given any behaviors that have been defined for the interface member, as well as given known characteristics of the interface member. Thus, for example, if a mapped interface member is of a type and/or is associated with defined behavior that requires data handling, then skeleton source code is generated for the interface member to receive and handle data, and if the mapped interface member is of a type and/or is associated with defined behavior that also requires event handling, then skeleton source code is generated for the interface member to receive and handle events. Bridge model builder 108 is configured to be used, for each behavior defined for a mapped interface member, to generate corresponding behavioral elements for architectural model 102, such as Internal Behavior elements in an AUTOSAR architectural model. Bridge model builder 108 is configured to be used, for each mapped interface member, to generate corresponding usage description elements for architectural model 102, such as ElementAccess, DataPoints, Events, etc., in an AUTOSAR architectural model.

A work product generator 110 is configured to generate, using conventional techniques, an architectural description document, such as an ARXML document in an AUTOSAR architectural model, from architectural model 102; implementation code, such as .C and .H files (e.g., written in the C programming language) for a UML/SysML model, from implementation/behavioral model 106 and the generated skeleton source code; and declaration files for operating system services, such as an RTE Application Programming Interface (API) .H file in an AUTOSAR architectural model, used by the implementation code generated for the interface members.

Any of the elements shown in FIG. 1 are preferably executed by or otherwise made accessible to a computer 112, such as by implementing any of the elements in computer hardware and/or in computer software embodied in a physically-tangible, computer-readable medium in accordance with conventional techniques.

Figure 2:
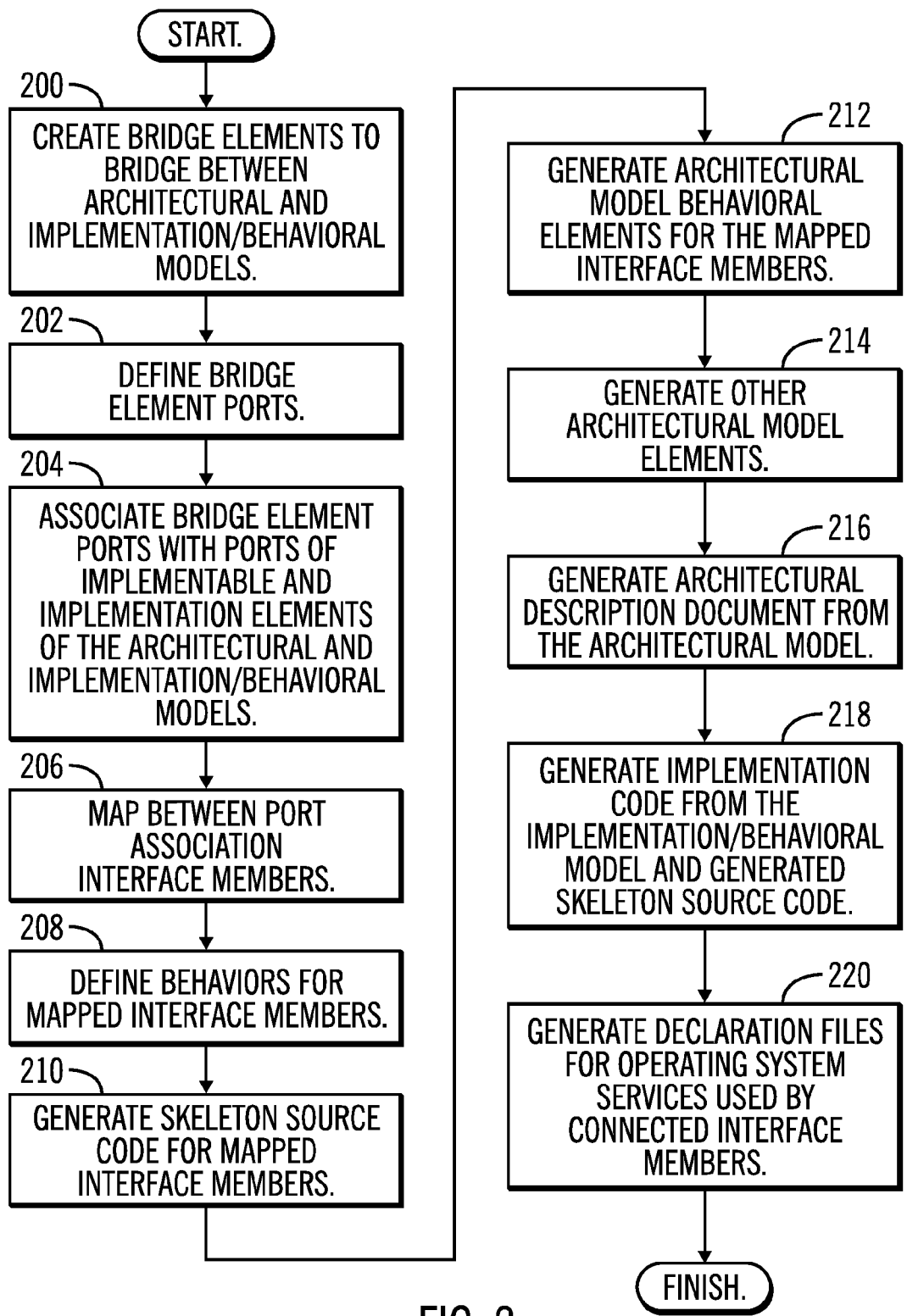
FIG. 2 is a simplified flowchart illustration of an exemplary method of operation of the system of FIG. 1, operative in accordance with embodiments of the invention.

Reference is now made to FIG. 2, which is a simplified flowchart illustration of a method for coupling architectural and implementation/behavioral models of a computer-based system, operative in accordance with embodiments of the invention. In the method of FIG. 2 a bridge element is created to bridge between an architectural model of a computer-based system, such as an AUTOSAR architectural model, and an implementation/behavioral model of the computer-based system, such as a UML/SysML model (block 200). The bridge element may be introduced into either of architectural model or the implementation/behavioral model or may exist independently of the models. One or more ports of the bridge element are defined (block 202). Each port of the bridge element is associated with a port of an implementable element of the architectural model, such as of an Atomic Software Component of an AUTOSAR architectural model, and a port of an implementation element of the implementation/behavioral model, such as of a class of a UML/SysML model (block 204). For each such bridge association, the members of the interface of the associated implementation element port are mapped to the members of the interface of the associated implementable element port (block 206). This mapping may be performed automatically or manually. One or more behaviors are defined for one or more of the mapped interface members (block 208), such as, for example, "when integer A receives data, run function UpdateDisplay( )." For each mapped interface member, skeleton source code is generated for the implementation/behavioral model from templates to represent one or more actions that are applicable given any behaviors that have been defined for the interface member, as well as given known characteristics of the interface member (block 210). For each behavior defined for a mapped interface member, corresponding behavioral elements are generated for the architectural model (block 212), such as Internal Behavior elements in an AUTOSAR architectural model. For each interface member, corresponding usage description elements are generated for the architectural model (block 214), such as ElementAccess, DataPoints, Events, etc., in an AUTOSAR architectural model. An architectural description document, such as an ARXML document in an AUTOSAR architectural model, is generated from the architectural model using conventional techniques (block 216). Implementation code, such as .C and .H files for a UML/SysML model, is generated from the implementation/behavioral model and generated skeleton source code using conventional techniques (block 218). Declaration files for operating system services, such as an RTE API .H file in an AUTOSAR architectural model, are generated for operating system services used by the implementation code generated for the interface members using conventional techniques (block 220).

Figure 3:
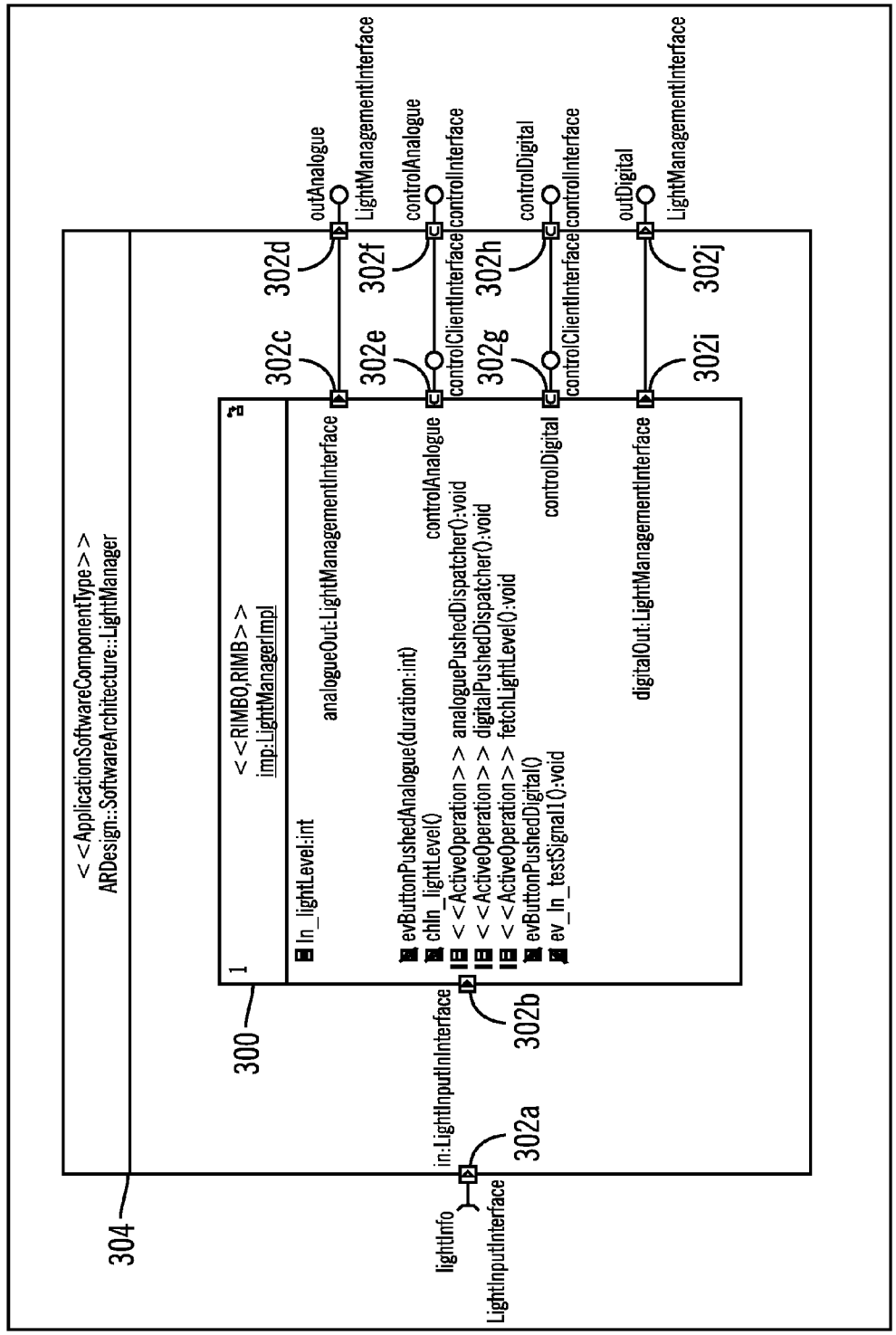
FIGS. 3 and 4 are simplified illustrations of elements of an exemplary implementation of the invention in accordance with embodiments of the invention.
Figure 4:
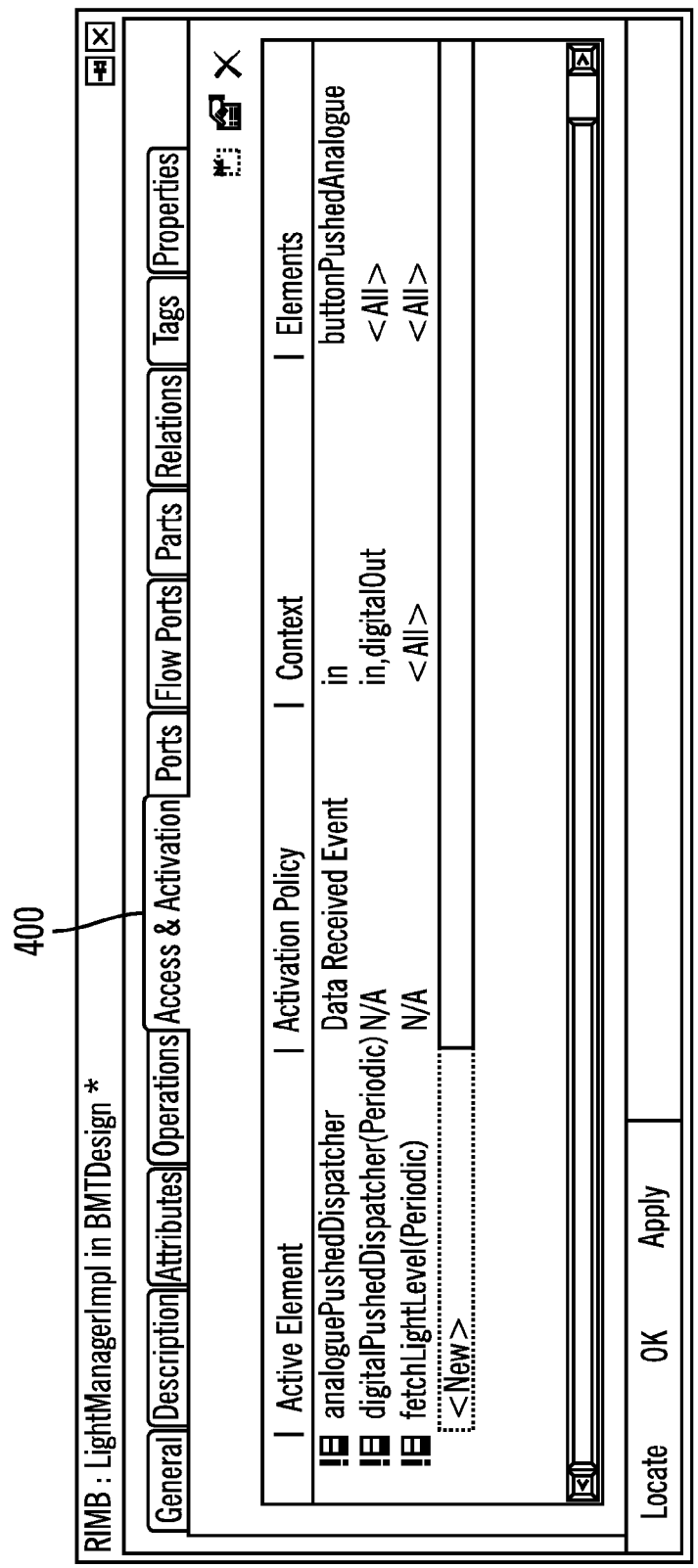

The system and method of FIGS. 1 and 2 may be appreciated in the context of the following example as supported by FIGS. 3 and 4, where IBM® RATIONAL® RHAPSODY®, commercially-available from International Business Machines Corporation, Armonk, N.Y., is used to implement the invention with respect to AUTOSAR and UML/SysML models of a computer-based system in order to automate the generation of AUTOSAR work products including ARXML documents, c-Documents (i.e., files containing sources in the language C), obj-Documents (i.e., object files), and h-Documents (i.e., files containing header files that are included in c-Documents), as well as to automate connection of a user implementation of the modeled system to the AUTOSAR domain, including AUTOSAR run-time environment (RTE) and AUTOSAR Ports. (IBM, RATIONAL, and RHAPSODY, are trademarks of International Business Machines Corporation in the United States, other countries, or both.) In the following example, an abstraction layer is created over the AUTOSAR domain, where AUTOSAR elements are represented using RHAPSODY® modeling, and implementation blocks are connected to the AUTOSAR elements represented in the model. After the system is described in this manner, RHAPSODY® generates lower-level AUTOSAR API calls in accordance with the system description, system source code, and the AUTOSAR XML (ARXML) file(s) to describe the system to AUTOSAR tools and compilers.

Referring now to FIG. 3, one or more instance objects are created of RHAPSODY® Implementation Blocks (RIMBs), such as RHAPSODY® Implementation Block Object (RIMBO) 300, to connect the UML/SysML domain to the AUTOSAR domain. In FIG. 3, the ports 302a . . . 302j are represented by squared elements. One or more ports 302a . . . 302j are defined on RIMBO 300, where each port 302a . . . 302j drives the generation of the appropriate AUTOSAR-specific setters/getters using the appropriate AUTOSAR RTE API. Each RIMBO 300 has one or more Active Elements (e.g., Class or Operation) that are implemented in the AUTOSAR domain as a Runnable Entity. AUTOSAR Internal Behavior artifacts are determined by activation policies associated with each of the Active Elements, as described in RHAPSODY® in an Activation/Access table, such as table 400 in FIG. 4, together with any associated Access Methods. User-defined Attributes are set to be Inter-Runnable variables, allowing various runnable entities to access these variables.

RIMBO 300 is used inside an AUTOSAR Atomic Software Component 304 to define the internal behavior and implementation for the software component. RIMBO 300 performs the tasks of receiving incoming data on ports 302a . . . 302j, handling the received data, sending data over ports 302a . . . 302j, calling operations on client ports, implementing operations on server ports, and performing calculations and algorithms as required to perform these tasks, including the execution of Statecharts.

Each RIMB may have associated Operations and Active operations, an Access/Activation table, Exclusive Area settings, Inter-Runnable Variables (i.e., Attributes), and (regular) Attributes. Each RIMB may have Sender/Receiver (S/R) ports and interfaces, where S/R ports have attributes that can be typed by a C type, or by RHAPSODY® event. C-type attributes are used as data inside the RIMB, while RHAPSODY® Event-type attributes are used as events and can trigger Statecharts. Access-Mode is preferably specified for each attribute. Each RIMB may also have Client/Server (C/S) ports and interfaces, where each C/S port has Operations, and where Call-Mode is specified for Each Operation Referring now to FIG. 4, Activation/Access table 400 specifies the policy for each active element, including Activation policy, Data Elements On ports, Operations on ports and Inter-Runnable variables to which the Active Element has access, and Exclusive Areas to which the Active element has access or in which it runs.

Once a system has been described in RHAPSODY® as above, RHAPSODY® performs model transformations to
- add elements derived from the description, such as AUTOSAR Internal behavior elements and AUTOSAR Implementation elements, and additional elements, as well as any such elements explicitly created by the user;
- examine the port connections between the elements and add the proper Data Receivers, Data Handlers, Data Receivers-and-Handlers, Data Senders, and Callers using the appropriate, mangled, AUTOSAR RTE API; and create Getters and Setters for attributes and Inter-Runnable variables, such as in accordance with the following pseudo-code for port attribute connections between the RHAPSODY® Domain and the AUTOSAR domain:

```
if( Attribute_Type_Is_RhapsodyData ){
    if ( IsQueued ){
        Call Queued Explicit access RTE API;
    }
    else if ( IsExplicit ){
        Call Non-Queued Explicit access RTE API;
    }
    else if ( IsImplicit ){
        Call Implicit access RTE API;
    }
}
else if( Attribute_Type_Is_RhapsodyEvent ){
    if ( RhapsodyEventWithArgument ){
        Call Queued Explicit access RTE API using argument;
    }
    else {
        Call Queued Explicit access RTE API using dummy;
    }
}
``` where the above pseudo-code may be used to select which section of the pseudo-code below should be incorporated into the generated application code:

```
Receive Data
    For attribute n_onlyAttr of type RhpInteger on RIMBReceiverPort North:
static Std_ReturnType receiveData_North_n_onlyAttr(RhpInteger* const n_onlyAttr) {
    return Rte_Read_Nox_n_onlyAttr(n_onlyAttr);
}
    Handle Data
    For attribute n_onlyAttr of type RhpInteger on RIMPReceiverPort North:
static void handleData_North_n_onlyAttr(RhpInteger n_onlyAttr) {
    North_n_onlyAttr = n_onlyAttr;
}
    Receive and Handle Data
    For attribute n_onlyAttr of type some-event on RIMBReceiverPort North:
static Std_ReturnType receiveAndHandleData_North_n_onlyAttr(void) {
    RhpInteger n_onlyAttr;
    Std_ReturnType retval = Rte_Read_Nox_n_onlyAttr(&n_onlyAttr);
    if(retval == RTE_E_OK){
        North_n_onlyAttr = n_onlyAttr;
    }
    return retval;
}
    Receive Event
    For attribute n_evArg of type some-event on RIMBReceiverPort North:
static Std_ReturnType receiveEvent_North_n_evArg(RhpInteger* const argument_0) {
    return Rte_Receive_Nox_n_evArg(argument_0);
}
    Handle Event
    For attribute n_evArg of type some-event on RIMBReceiverPort North:
static void handleEvent_North_n_evArg(RhpInteger argument_0) {
    RiCGEN(&rimb_0, event_1(argument_0));
}
    Receive and Handle Event
    For attribute n_evArg of type some-event on RIMBReceiverPort North:
static Std_ReturnType receiveAndHandleEvent_North_n_evArg(void) {
    RhpInteger_argument_0;
    Std_ReturnType retval = Rte_Receive_Nox_n_evArg(&argument_0);
    if(retval == RTE_E_OK){
        RiCGEN(&rimb_0, event_1(argument_0));
    }
    return retval;
}
    Send Data
    For attribute s_di of type RhpReal on RIMBSenderPort Smouth:
static Std_ReturnType sendData_Smouth_s_di(RhpReal s_di) {
    return Rte_Write_Sayyid_s_di(s_di);
}
```

```
    Send Event
        For attribute s_ev of type some-event on RIMBSenderPort Smouth:
static Std_ReturnType sendEvent_Smouth_s_ev(void) {
    return Rte_Send_Sayyid_s_ev(0);
}
    Callers
        For operation opNoArgs on RIMBClientPort Colombo:
static Std_ReturnType call_Colombo_opNoArgs(void) {
    return Rte_Call_Cairo_opNoArgs( );
}
```

In the above example the RHAPSODY® system model definition may be reused across multiple architectural-type domains by:

avoiding direct operating system API calls. After connecting the ports and setting the definitions of function activation, data are used in the implementation/behavioral domain as data elements, and no effort is required to performing the actions to fetch the data and keep the data concurrent; and decoupling the user code from the specific platform or environment by using the data in the implementation/behavioral domain as a data element of that domain without regard to the architectural domain where the data originated.

Figure 5:
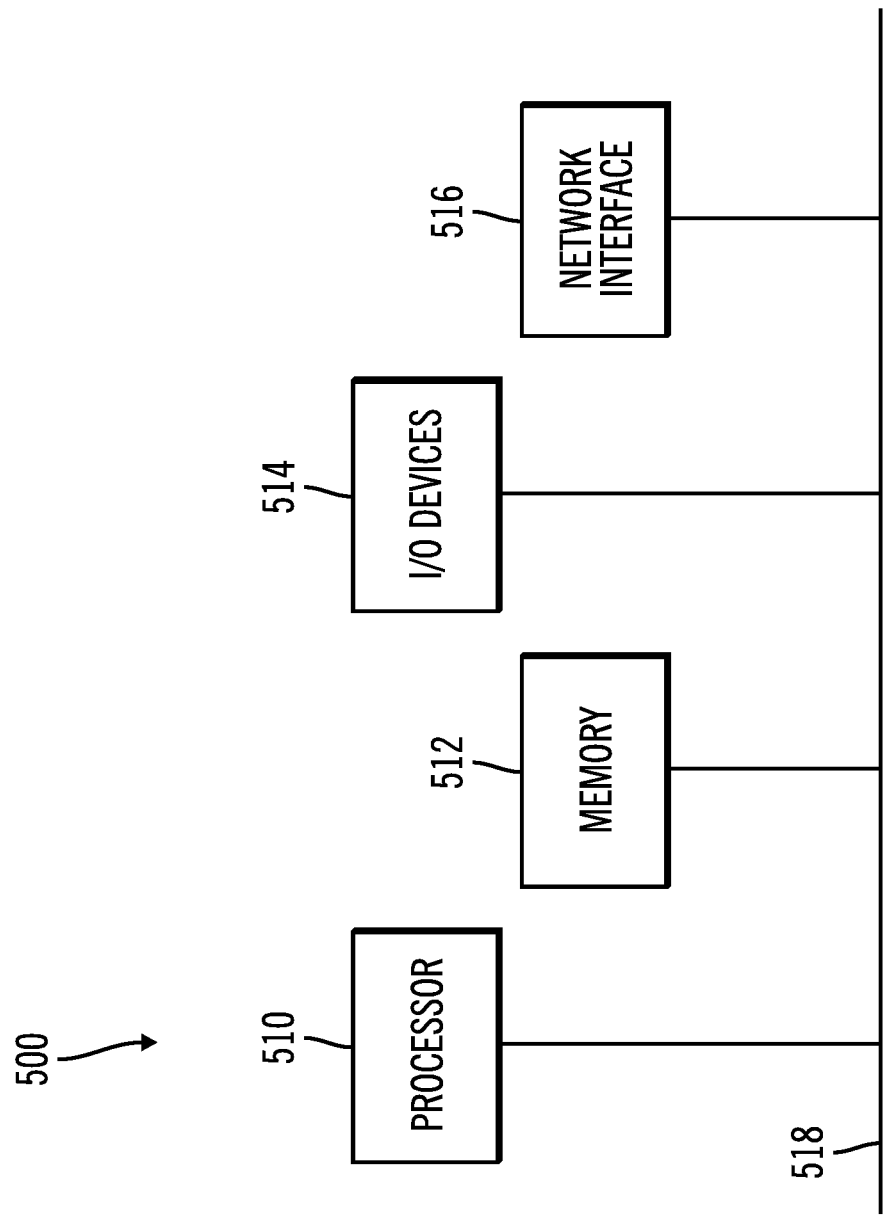
FIG. 5 is a simplified block diagram illustration of an exemplary hardware implementation of a computing system, constructed and operative in accordance with embodiments of the invention.

Referring now to FIG. 5, block diagram 500 illustrates an exemplary hardware implementation of a computing system in accordance with which one or more components/methodologies of the invention (e.g., components/methodologies described in the context of FIGS. 1-4) may be implemented, according to embodiments of the invention.

As shown, the techniques for controlling access to at least one resource may be implemented in accordance with a processor 510, a memory 512, I/O devices 514, and a network interface 516, coupled via a computer bus 518 or alternate connection arrangement.

It is to be appreciated that the term "processor" as used herein is intended to include any processing device, such as, for example, one that includes a CPU (central processing unit) and/or other processing circuitry. It is also to be understood that the term "processor" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. Such memory may be considered a computer readable storage medium.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

The flowchart and block diagrams in the Figures illustrate the architecture, functionality, and operation of possible implementations of systems, methods and computer program products according to various embodiments of the invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be appreciated that any of the elements described hereinabove may be implemented as a computer program product embodied in a computer-readable medium, such as in the form of computer program instructions stored on magnetic or optical storage media or embedded within computer hardware, and may be executed by or otherwise accessible to a computer (not shown).

While the methods and apparatus herein may or may not have been described with reference to specific computer hardware or software, it is appreciated that the methods and apparatus described herein may be readily implemented in computer hardware or software using conventional techniques.

While the invention has been described with reference to one or more specific embodiments, the description is intended to be illustrative of the invention as a whole and is not to be construed as limiting the invention to the embodiments shown. It is appreciated that various modifications may occur to those skilled in the art that, while not specifically shown herein, are nevertheless within the true spirit and scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The foregoing description of embodiments of the invention has been presented for the purposes of illustration and description. It is not intended to be exhaustive or to limit the embodiments to the precise form disclosed. Many modifications and variations are possible in light of the above teaching. It is intended that the scope of the embodiments be limited not by this detailed description, but rather by the claims appended hereto. The above specification, examples and data provide a complete description of the manufacture and use of the composition of the embodiments. Since many embodiments may be made without departing from the spirit and scope of the invention, the embodiments reside in the claims hereinafter appended or any subsequently-filed claims, and their equivalents.

The invention claimed is:

1. A method for coupling architectural and implementation/behavioral models of a computer-based system, the method comprising:
creating, with a processor of a computer, a first bridge element to bridge between an architectural model of a computer-based system and an implementation/behavioral model of the computer-based system, wherein the first bridge element is associated with a first activation and access table describing, for each of one or more first active elements, first data to which that first active element has access and a first activation policy associated with that first active element;
creating, with the processor of the computer, a second bridge element to bridge between the architectural model of a computer-based system and the implementation/behavioral model of the computer-based system, wherein the second bridge element is associated with a second activation and access table describing, for each of one or more second active elements, data to which that second active element has access and an activation policy associated with that second active element;
to couple the architectural model and the implementation/behavioral model in a first manner, generating, with the processor of the computer, first code using the first bridge element, the one or more first active elements associated with the first bridge element, the first data to which each of the one or more first active elements have access, and the first activation policy associated with each of the one or more first active elements; and
to couple the architectural model and the implementation/behavioral model in a second manner, generating, with the processor of the computer, second code using the second bridge element, the one or more second active elements associated with the second bridge element, the second data to which each of the one or more second active elements have access, and the second activation policy associated with each of the one or more second active elements.

2. The method of claim 1 wherein the first bridge element is created within one of the architectural model and the implementation/behavioral model.

3. The method of claim 1 wherein the architectural model is built in accordance with Automotive Open System Architecture (AUTOSAR) modeling methodology.

4. The method of claim 1 wherein the implementation/behavioral model is built in accordance with Uniform Modeling Language (UML)/Systems Modeling Language (SysML) modeling methodology.

5. The method of claim 1, further comprising:
defining a port of the first bridge element;
associating the port of the first bridge element with an implementable element port of an implementable element of the architectural model and with an implementation element port of an implementation element of the implementation/behavioral model;
mapping an interface member of the implementation element port to an interface member of the implementable element port;
generating, from a template, skeleton source code applicable for the mapped interface member;
generating a usage description element for the architectural model corresponding to the mapped interface member;
generating an architectural description document from the architectural model;
generating implementation code from the implementation/behavioral model and the generated skeleton source code; and
generating a declaration file for an operating system service for use by the implementation code.

6. The method of claim 5 wherein a member name and type of the interface member of the implementation element port match a member name and type of the interface member of the implementable element port.

7. The method of claim 5 and further comprising:
defining a behavior for the mapped interface member.

8. The method of claim 7 wherein the skeleton source code is generated to represent an action that is applicable given the defined behavior and a known characteristic of the mapped interface member.

9. The method of claim 7 and further comprising:
generating for the architectural model a behavioral element corresponding to the defined behavior.

10. The method of claim 5 wherein generating the architectural description document comprises generating an Automotive Open System Architecture (AUTOSAR) ARXML document.

11. The method of claim 5 wherein generating the implementation code comprises generating at least one of .C and .H files for a Uniform Modeling Language (UML)/Systems Modeling Language (SysML) model.

12. The method of claim 5 wherein generating the declaration file comprises generating an Automotive Open System Architecture (AUTOSAR) RTE Application Programming Interface (API) .H file.

13. The method of claim 5 wherein the implementable element is an Atomic Software Component of an Automotive Open System Architecture (AUTOSAR) architectural model, and wherein the implementation element is a class of a Uniform Modeling Language (UML)/Systems Modeling Language (SysML) model.

* * * * *